United States Patent [19]
Amir et al.

[11] Patent Number: 5,127,061
[45] Date of Patent: Jun. 30, 1992

[54] REAL-TIME THREE-DIMENSIONAL IMAGING TECHNIQUE

[75] Inventors: Israel Amir, Ewing; Frank P. Higgins, Trenton, both of N.J.

[73] Assignee: AT&T Bell Laboratories, Murray Hill, N.J.

[21] Appl. No.: 620,873

[22] Filed: Dec. 3, 1990

[51] Int. Cl.$^5$ .............................................. G06K 9/00
[52] U.S. Cl. .......................................... 382/1; 382/8; 382/58; 358/88; 356/12
[58] Field of Search ............... 382/1, 8, 28, 41, 62, 382/58; 358/88, 107, 101, 106; 364/460, 458; 356/12, 360; 250/563, 559; 350/522

[56] References Cited

U.S. PATENT DOCUMENTS

| | | | |
|---|---|---|---|
| 4,731,853 | 3/1988 | Hata et al. | 382/1 |
| 4,731,860 | 3/1988 | Wahl | 382/41 |
| 4,811,410 | 3/1989 | Amir et al. | 382/8 |

OTHER PUBLICATIONS

"Experiments with the Intensity Ratio Depth Sensor," B. Carrihill et al., *Computer Vision, Graphics, and Image Processing* vol. 32, 1985, pp. 337-358.

Primary Examiner—David K. Moore
Assistant Examiner—Yon Jung
Attorney, Agent, or Firm—Robert B. Levy

[57] ABSTRACT

A three-dimensional image of the surface (12) on an object (14) is obtained in real time by a system (10) which includes first and second reflective surfaces (32,38). The first reflective surface successively reflects a separate one of the first and second lines of light (26,28) onto the surface of the object so that each line of light strikes a first strip of area (34) at an acute angle. The second reflective surface reflects the field of view of a linescan camera (40) onto the object's surface so that the camera captures the image of a second strip of area (41) contiguous with the first strip. The first and second reflective surfaces are rapidly rotated in unison by one or more actuators (50,52) such that the object's surface is spanned by the camera each time the surface is spanned by a successive one of the first and second lines of light. A three-dimensional image of each successive second strip imaged by the camera is obtained from a predetermined relationship between the intensity sensed by the camera for that strip when the corresponding first strip is successively illuminated by the first and second lines of light.

7 Claims, 2 Drawing Sheets

REAL-TIME THREE-DIMENSIONAL IMAGING TECHNIQUE

TECHNICAL FIELD

This invention relates to a method and apparatus for obtaining a three-dimensional image of an object sufficiently rapidly to allow such images to be obtained in real time.

BACKGROUND OF THE INVENTION

The ability to obtain a three-dimensional image of an object is usually preferred over a two-dimensional image because of the added detail that a three-dimensional image provides. For example, a three-dimensional image of a circuit board containing solder paste deposits, when taken prior to soldering, usually reveals the height of the paste, thus affording an indication of whether the paste has been properly applied to the board. By the same token, a three-dimensional image of the circuit board following soldering will reveal instances of poor solder wetting, a defect often not ascertainable from a two-dimensional image of the board.

In U.S. patent application Ser. No. 440,948, filed Nov. 24, 1989, in the name of Israel Amir, and assigned to the same assignee as the instant application, there is disclosed a technique for obtaining a three-dimensional image of a surface on an object, such as a circuit board, with a linescan vision camera. The circuit board to be imaged is placed on a mechanical slide so that the board lies below a linescan camera and each of a pair of light sources. The light sources each have their beam directed through a optical assembly, typically a circle-to-line converter which converts the beam into a line of light directed at the board surface at an acute angle at a first strip of area.

To obtain a three-dimensional image of the circuit board, a first one of the light sources is rendered operative and the board is displaced by the slide so as to be spanned by the first line of light while the linescan camera captures the image of a successive one of a plurality of second strips of area on the board, each adjacent to the first strip at which the line of light is directed. Thereafter, the circuit board is spanned by the second line of light while the linescan camera captures the image of each successive second strip of area on the board surface as before. The ratio of the intensity sensed by the camera for each successive second strip, when the circuit board is spanned by the first line of light, to the intensity when the board is spanned by the second line of light yields a measure of the height of the features in each such second strip. The collective height information yields a three-dimensional image of the board surface.

While the three-dimensional imaging technique described in the Amir '948 application has been found to yield exceptionally detailed three-dimensional images, the technique does suffer a disadvantage. In order to obtain a three-dimensional image, the circuit board must be displaced past the linescan camera twice by the mechanical slide so that the board can be imaged by the camera while successively spanned by the first and second lines of light. The overall time required for each span, while relatively small, is nonetheless much longer than is allowable for "real-time" three-dimensional imaging. To accomplish real-time three-dimensional imaging, it is necessary to capture a three-dimensional image in less than 1/30 of a second, the time between successive scans of a conventional raster-scan television system, a physical impossibility with the mechanical slide arrangement employed in the Amir '948 application.

Thus, there is a need for a technique for obtaining a three-dimensional image of a circuit board in real time.

SUMMARY OF THE INVENTION

Briefly, in accordance with a preferred embodiment of the invention, a method is provided for rapidly obtaining a three-dimensional image of a surface on an object in real time. In accordance with the method, a first line of light is reflected, via a first rotatable mirrored surface, onto the surface of the object so as to be directed at a first strip of area thereon at an acute angle. The field of view of a linescan camera is reflected, via a second rotatable mirrored surface, onto a second strip of area contiguous with the first strip, thus allowing the camera to capture the image of the strip and determine the intensity thereof. The first and second mirrored surfaces are rotated in unison, typically by way of separate one of a pair of galvanoelectric or acoustic actuators, such that the first line of light, together with the field of view of the linescan camera, is spanned across the surface very rapidly, typically in less than 16 milliseconds. Thereafter, a second line of light is substituted for the first one so that the second line of light is reflected by the first mirrored surface onto the surface to be imaged so as to strike the first strip at an acute angle. The first and second mirrored surfaces are rapidly rotated in unison as before so that the surface of the object is simultaneously spanned by the second line of light and the field of view of the linescan camera. The height of the features in each successive second strip is obtained in accordance with a predetermined relationship between the intensity of the image of that strip when the surface is illuminated by the first line of light and then is illuminated by the second line of light.

DETAILED DESCRIPTION

Figure 1:
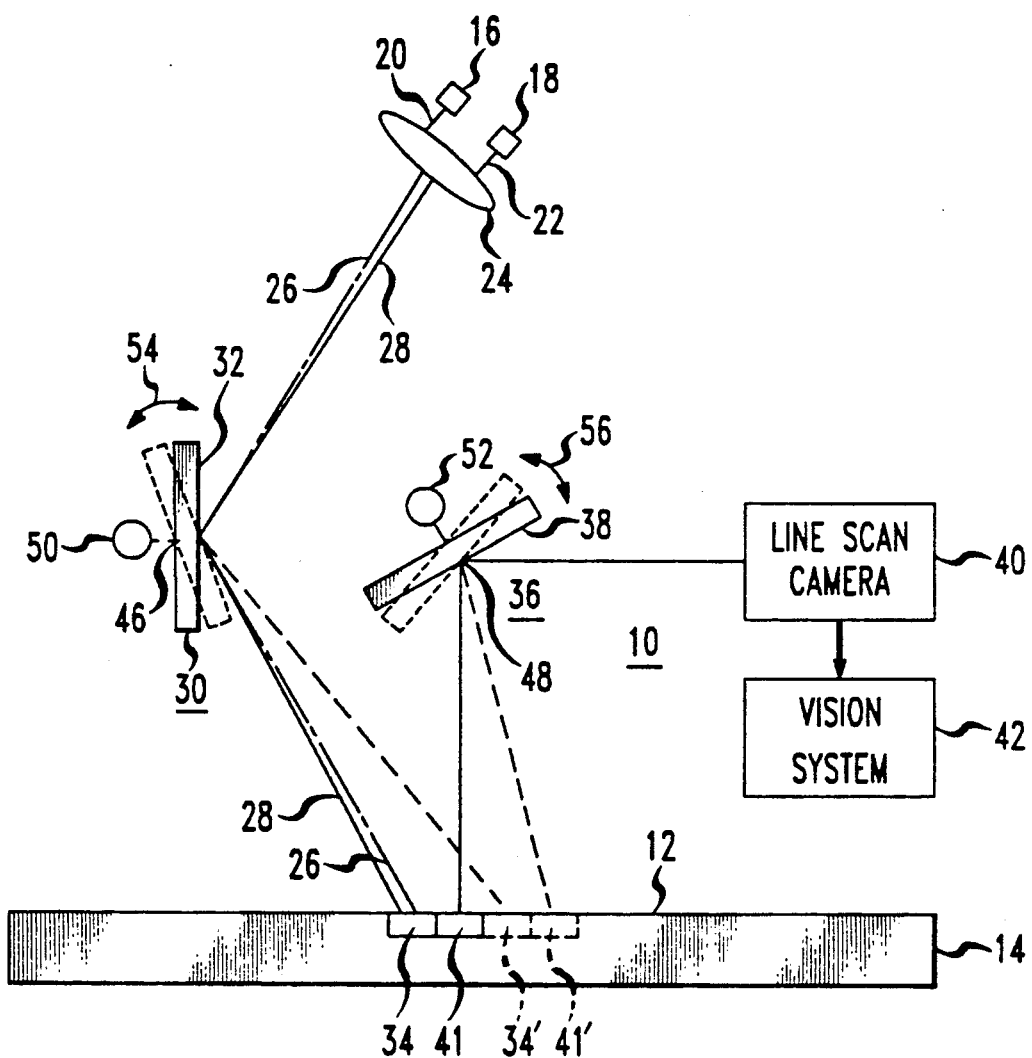
FIG. 1 is a frontal view of a first embodiment of a system for rapidly obtaining a three-dimensional image in accordance with the invention.

FIG. 1 is a frontal view of a first preferred embodiment of a system 10, in accordance with the invention, for obtaining a three-dimensional image of a surface 12 on an object 14, such as a circuit board, in real time using the technique of sharp gradient of illumination described in the aforementioned Amir '948 application (herein incorporated by reference). The system 10 comprises first and second light sources 16 and 18, typically of the fiber-optic illuminator variety, for producing a separate one of a pair of light beams 20 and 22, respectively. As will be discussed in greater detail below, only one of the light sources 16 and 18 is operational at any given time.

The beams 20 and 22 of the light sources 16 and 18, respectively, are directed into an optical assembly 24, typically comprised of a circle-to-line converter and cylindrical lens, which converts the beam of each source into a separate one of a pair of lines of light 26 and 28, repectively. Each of the lines of light 26 and 28 is directed at approximately the same acute angle at a mirror 30 so as to be reflected by the mirror's reflective surface 32 towards the surface 12 of the circuit board 14 at an acute angle so as to strike the first strip of area 34 on the surface whose longitudinal axis extends normal to the plane of the drawing.

In addition to the mirror 30, the system 10 includes a second mirror 36 having a reflective surface 38 thereon. The reflective surface 38 on the mirror 36 serves to reflect the field of view of a linescan camera 40 onto the surface 12 so that the camera, which has a long but narrow field of view, will capture the image of a second narrow strip of area 41 on the surface 12 which is contiguous to the strip 34. While the first strip 34 is illuminated by a separate one of the first and second lines of light 26 and 28, a portion of the light will spill over and illuminate the second strip 41, the amount of illumination depending on the profile of the line of light and the height of the surface 12.

The linescan camera 40 has its output signal coupled to a vision system 42 of the type described in U.S. Pat. No. 4,811,410 (herein incorporated by reference). As described in that patent, the vision system 42 serves to process the image captured by the linescan camera 40 to establish the intensity of those portions of interest in the imaged strip 41. The vision system 42 produces a video signal indicative of the intensity of the captured image.

In accordance with the invention, each of the mirrors 30 and 36 is made extremely lightweight and each is mounted by means of a gimbal assembly (not shown) for at least partial rotation about its axes 46 and 48, which are each parallel to the longitudinal axis of a corresponding one of the strips 34 and 41. A separate one of a pair of actuators, 50 and 52, typically of the galvanoelectric or acoustic variety, is provided for rotating each of the mirrors 30 and 32 through a separate one of arcs 54 and 56 at a very high angular speed.

The actuators 50 and 52 are controlled by the vision system 42 to rotate the mirrors 30 and 36 in unison in the same direction (e.g., counterclockwise as seen in FIG. 1). After the mirror 30 is rotated counterclockwise through a short arc 54, the line of light then directed into the mirror, say line of light 26 for purposes of discussion, will strike the surface 12 to the left of where it previously struck the surface. In other words, instead of being directed at the strip 34, the line of light is directed at a new strip 34' directly to the right of strip 34. In a similar manner, after the mirror 36 has been rotated through a short arc 56 in a counterclockwise direction, the field of view of the linescan camera 40, instead of being reflected onto the strip 41, will be reflected onto a new strip 41' located to the right of the strip 41. As may now be appreciated, as the mirror 36 is rotated through its arc 56, the particular one of the lines of light 26, 28 directed at the mirror is spanned across the surface 12 so as to be successively directed at each of a plurality strips 34, 34' ... etc. Similarly, as the mirror 36 is rotated in unison with the mirror 30, the field of view of the linescan camera 40 is spanned across the surface so as to capture the image of a successive one of a plurality of strips 41, 41' ... etc.

As discussed, each of the mirrors 30 and 36 is made extremely lightweight and each of the actuators 50 and 52 is chosen so as to be capable to rotating its corresponding mirror at a high angular speed, typically fast enough so that the surface 12 can be spanned by a successive one of the lines of light 26 and 28 while being simultaneously spanned by the linescan camera 40 at least once every 16 milliseconds. Thus, the surface 12 can be successively spanned by the line of light 26 and then by the line of light 28 every 1/30 of a second.

Each time the surface 12 is spanned by a successive one of the lines of light 26 and 28, the vision processor 42 establishes the intensity of the image of each successive strip 41 imaged by the linescan camera 40. As taught in the aforementioned Amir '948 application, the height of topographical features (not shown) in each successively imaged strip 41 can be determined from a predetermined relationship between the intensity of the imaged strip while the surface 12 is spanned by the first line of light 26, and the image of the imaged strip intensity while the surface is spanned by the second line of light 28. By knowing the profile characteristics (parameters) of the lines of light 26 and 28, then the feature height can be obtained from the ratio of the sensed image intensities. By knowing the height of the features in each successively imaged strip 41, a three-dimensional image of the entire surface 12 of the circuit board 10 can be readily obtained.

Figure 2:
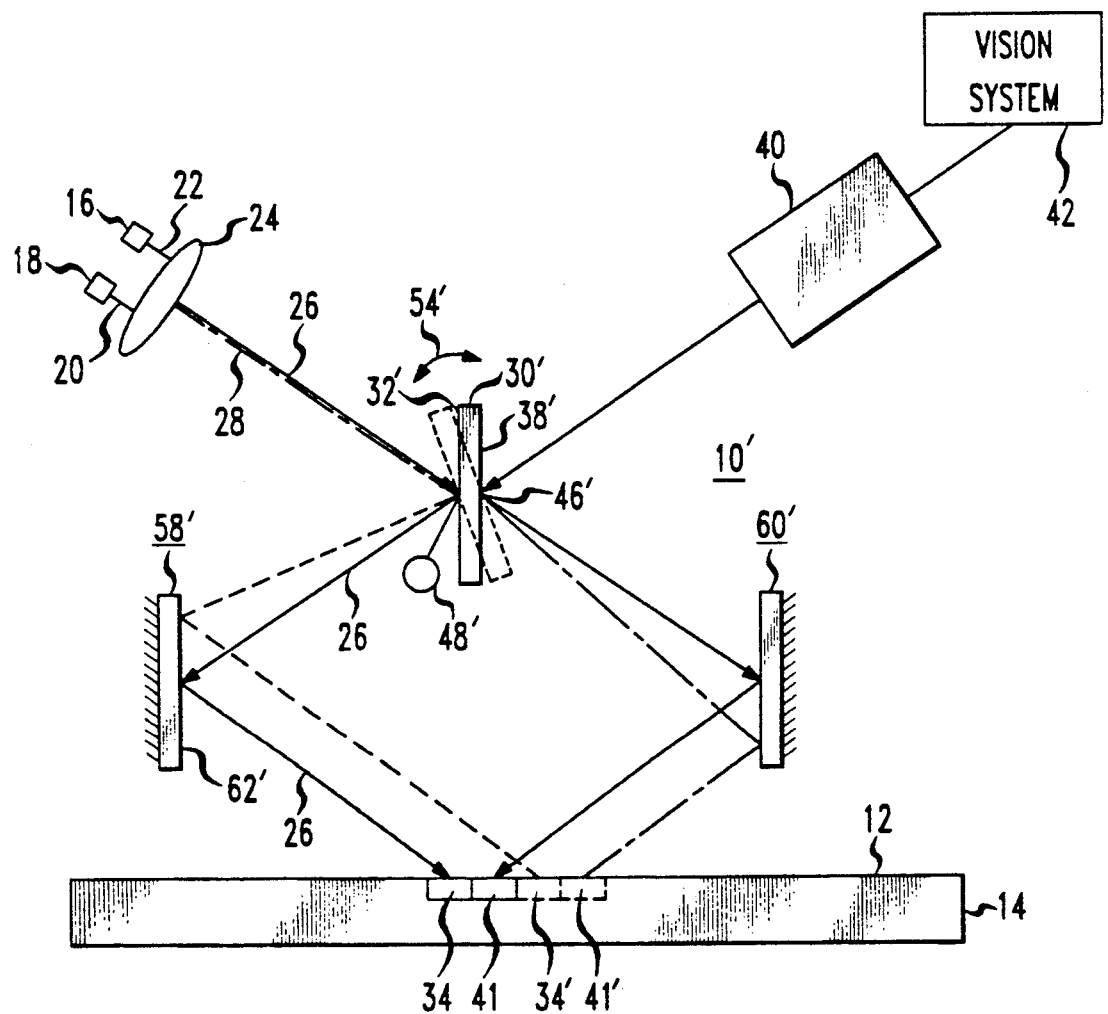
FIG. 2 is a frontal view of a second embodiment of a system for rapidly obtaining a three-dimensional image in accordance with the invention.

Referring to FIG. 2, there is shown a front view of a second preferred embodiment of a system 10' for obtaining a three-dimensional image of a surface 12 of an object 14, such as a circuit board or the like, in real time. The system 10' is identical to the system 10 of FIG. 1 except that instead of employing two rotatable mirrors 30 and 36 as seen in FIG. 1, the system of FIG. 2 utilizes a single rotatable mirror 36' and a pair of stationary mirrors 56' and 58'. Unlike mirrors 30 and 36 of FIG. 1, which each have a single reflective surface 32 and 38 thereon, respectively, the mirror 30' of FIG. 2 is made such that each of its opposed major surfaces 32' and 38' is reflective. The reflective surface 32' of the mirror 30' serves to reflect a separate one of the lines of light 26 and 28 at the mirror 58' for reflection by its reflective surface 62' onto the surface 12 so as to be directed at the strip 41 at an acute angle. In a similar fashion, the reflective surface 38' on the mirror 32' serves to reflect the field of view of the linescan camera 40 into the mirror 60' whose reflective surface 64' reflects the camera's field of view onto the surface 12 so that the camera images the strip 41.

Like the mirror 30 of FIG. 1, the mirror 30' of FIG. 2 is mounted on a gimbal (not shown) so as to rotate about its axis 46' which is parallel to the longitudinal axes of the strips 34 and 41. An actuator 48' identical to each of the actuators 48 and 50 of FIG. 1, is coupled to the mirror 30 to rotate the it through an arc 54' under the control of the vision system 42. As can be seen in FIG. 2, when the mirror 30' is rotated, say counterclockwise, the line of light directed at the mirror, say line 26, will no longer be directed at the strip 34, but at a new strip 34' to the right of strip 34. At the same time, the field of view of the linescan camera 40, which had been reflected onto the strip 41, will now be reflected at a new strip 41' located to the right thereof. As may now be appreciated, by rotating the single mirror 30', a successive one of the lines of light 26 and 28, and the field of view of the linescan camera 40, respectively may be spanned across the surface 12 simultaneously. By spanning the surface 12 with a successive one of the lines of light 26 and 28, while spanning the surface with the linescan camera 40 each time the surface is illuminated by each line of light, a three-dimensional image can be obtained in the same manner as described previously. Like the mirrors 30 and 36' the mirror 30' is made very lightweight and is rotated sufficiently rapidly by the actuator 48' to allow the surface 12 to be spanned at least twice every 33 milliseconds to allow a three-dimensional image of the surface to be obtained in real time.

The foregoing describes a system 10 for obtaining a three-dimensional dimensional image of a surface 12, on an object 14 in real time by successively spanning a successive one of a pair of lines of light 26, 26 and the field of view of a linescan camera 42 across the surface via a separate one of a pair of reflective surfaces 32, 38.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for rapidly obtaining a three-dimensional image of a surface on an object comprising the steps of:
   (a) reflecting a first line of light, via at least a first rotatable mirrored surface, onto a surface of an object which is to be imaged, so that the line of light strikes a firsts trip of area thereon;
   (b) reflecting the image of a second strip of area on the surface to be imaged, at least contiguous to the first strip of area, via at least a second rotatable reflected surface, into a linescan camera which serves to capture the image of the second strip and establish the intensity thereof;
   (c) rotating the first and second reflective surfaces in unison to span the first line of light across the surface of the object so that the first line of light is successively directed at each of a plurality of first strips while the field of view of the linescan camera is spanned across the surface so that the camera successively images each of a plurality of second strips;
   (d) extinguishing the first line of light, repositioning the first mirrored surface, and reflecting a second line of light, via at least the first reflective surface, onto the surface to be imaged to strike the first strip of area;
   (e) rotating the first and second reflective surfaces in unison to span the second line of light across the surface of the object so that the second line of light is successively directed at each of a plurality of first strips while the field of view of the linescan camera is spanned across the surface to successively image each of the plurality of second strips; and
   (f) determining the height of the features in each successive second strip in accordance with a predetermined relationship between the intensity of the image of each such successive second strip when the first line of light is spanned across the surface and the intensity of such second strip when the surface is spanned by the second line of light.

2. The method according to claim 1 wherein the surface of the object is successively spanned by the first and second lines of light at least every 1/30 of a second.

3. The method according to claim 1 wherein:
   (a) each of the first and second reflective surfaces comprises an opposite side of a single mirror;
   (b) each of the first and second lines of light is successively reflected, via the first reflective surface, into a third reflective surface which reflects each such line of light onto the surface of the object; and
   (c) the field of view of the linescan camera is reflected, via the second reflective surface, onto a fourth reflective surface for reflection onto the surface of the object.

4. The method according to claim 3 wherein the first and second reflective surfaces are rotated in unison by rotating the single mirror.

5. The method according to claim 1 wherein each of the first and second reflective surfaces comprises the reflective surface of the first and second separate mirrors and wherein each of the first and second reflective surfaces is rotated by rotating the first and second mirrors in unison.

6. A system for rapidly obtaining a three-dimensional image of a surface on an object comprising:
   a first rotatable reflector having a reflective surface thereon;
   a second rotatable reflector having a reflective surface thereon;
   first means for producing a first line of light which is directed into the reflective surface on the first reflector for reflection onto the surface of the object to strike a first strip of area thereon;
   second means for producing a second line of light during intervals when the first line of light is extinguished, the second line of light being directed into the reflective surface on the first reflector for reflection thereby onto the surface of the object to strike the first strip of area thereon;
   a linescan camera having a long but narrow field of view for capturing an image appearing in its field of view, the field of view of the linescan camera being reflected by the reflective surface of the second reflector onto the surface of the object so that the camera captures the image of a second strip of area contiguous to the first strip of area;
   first actuator means for rapidly rotating the first reflector so that a separate one of the first and second lines of light may be successively spanned across the surface of the object;
   second actuator means for rapidly rotating the second reflector in unison with the first reflector so that the field of view of the linescan camera may be spanned across the surface of the object in unison with a separate one of the first and second lines of light; and
   a vision processor for processing the image captured by the linescan camera as its field of view is spanned across the surface of the object, simultaneously with a separate one of the first and second lines of light, to establish a three-dimensional image of the surface in accordance with a prescribed relation of the intensity of image captured by the camera when the surface is spanned by the first line of light and the intensity when the surface of the object is spanned by the second line of light.

7. A system for rapidly obtaining a three-dimensional image of a surface on an object comprising:
   a first mirror having first and second opposed reflecting surfaces;
   a second reflector having a reflective surface thereon;
   a third reflector having a reflective surface thereon;
   first means for producing a first line of light which is directed into the first reflective surface on the first reflector for reflection thereby into the reflective surface on the second reflector for reflection thereby onto the surface of the object to strike the first strip of area thereon;
   second means for producing a second line of light during intervals when the first line of light is extinguished, the second line of light being directed into the first reflective surface on the first reflector, for reflection thereby into the reflective surface on the second reflector, for reflection thereby onto the surface of the object to strike the first strip of area thereon;

a linescan camera having a long but narrow field of view for capturing an image appearing in its field of view, the field of view of the linescan camera being reflected by the second reflective surface of the first reflector, into the reflective surface on the third reflector, for reflection thereby onto the surface of the object, so that the camera captures the image of a second strip of area contiguous to the first strip of area;

actuator means for rapidly rotating the first reflector when a separate one of the first and second lines of light is directed at the first reflective surface of the first reflector, each line of light spanned across the surface of the object simultaneously with the field of view of the linescan camera; and a vision processor for processing the image captured by the linescan camera as its field of view is spanned across the surface of the object, simultaneously with a separate one of the first and second lines of light, to establish a three-dimensional image of the surface in accordance with a prescribed relation of the intensity of the image captured by the camera when the surface is spanned by the first line of light, and the intensity when the surface of the object is spanned by the second line of light.

* * * * *